United States Patent
Noh et al.

(10) Patent No.: US 10,684,321 B2
(45) Date of Patent: Jun. 16, 2020

(54) PRINTED CIRCUIT BOARD INSPECTING APPARATUS, METHOD FOR DETECTING ANOMALY IN SOLDER PASTE AND COMPUTER READABLE RECORDING MEDIUM

(71) Applicant: KOH YOUNG TECHNOLOGY INC., Seoul (KR)

(72) Inventors: Jeong Kyu Noh, Seoul (KR); Jae Hwan Lee, Seoul (KR); Duk Young Lee, Suwon-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 182 days.

(21) Appl. No.: 15/852,675

(22) Filed: Dec. 22, 2017

(65) Prior Publication Data
US 2019/0195939 A1    Jun. 27, 2019

(30) Foreign Application Priority Data

Dec. 21, 2017    (KR) .................. 10-2017-0177391

(51) Int. Cl.
*G06K 9/00*    (2006.01)
*G01R 31/28*    (2006.01)
(Continued)

(52) U.S. Cl.
CPC .............. *G01R 31/28* (2013.01); *B41F 15/26* (2013.01); *B41F 33/0027* (2013.01);
(Continued)

(58) Field of Classification Search
CPC .. G01R 31/28; G01N 21/8806; H05K 1/0268; H05K 1/0269; H05K 3/34;
(Continued)

(56) References Cited

U.S. PATENT DOCUMENTS 6,574,358 B1 *    6/2003    Koljonen .............. G06T 7/0004
                                                      382/147
6,810,138 B1    10/2004    Schanz
(Continued)

FOREIGN PATENT DOCUMENTS

CN    1262025    8/2000
CN    1194592    3/2005
(Continued)

OTHER PUBLICATIONS

Korean Office Action with English translation corresponding to Application No. 10-2017-0177391, dated May 29, 2019.
(Continued)

*Primary Examiner* — Aaron W Carter
(74) *Attorney, Agent, or Firm* — Kile Park Reed & Houtteman PLLC

(57) ABSTRACT

A printed circuit board inspection apparatus obtains measurement shape information about each of a plurality of solder pastes printed on a first printed circuit board through a plurality of apertures and aperture shape information about each of the plurality of apertures, obtains probability values that a first solder paste printed through a first aperture of the plurality of apertures and each of a plurality of second solder pastes printed through second apertures other than the first aperture of the plurality of apertures have the measurement shape information when the first solder paste and the plurality of second solder pastes are printed on the first printed circuit board, by applying the measurement shape information and the aperture shape information to a machine-learning based model, and detects whether an anomaly in the first solder paste occurred based on the probability values.

17 Claims, 11 Drawing Sheets

(51) Int. Cl.
  *G06T 7/00* (2017.01)
  *B41F 33/00* (2006.01)
  *B41F 15/26* (2006.01)
  *G01N 21/88* (2006.01)
  *H05K 1/02* (2006.01)
  *H05K 3/34* (2006.01)
  *H05K 13/08* (2006.01)

(52) U.S. Cl.
  CPC ...... *B41F 33/0036* (2013.01); *B41F 33/0045* (2013.01); *G01N 21/8806* (2013.01); *G06T 7/0004* (2013.01); *H05K 1/0268* (2013.01); *H05K 1/0269* (2013.01); *H05K 3/34* (2013.01); *H05K 13/08* (2013.01); *G06T 2207/20081* (2013.01); *G06T 2207/30141* (2013.01); *G06T 2207/30152* (2013.01); *H05K 3/3484* (2013.01)

(58) Field of Classification Search
  CPC ............... H05K 3/3484; H05K 13/08; G06T 2207/30141; G06T 2207/30152; G06T 7/0004; B41F 33/0027; B41F 33/0036; B41F 33/0045; B41F 15/26
  See application file for complete search history.

(56) References Cited

U.S. PATENT DOCUMENTS

| | | | | |
|---|---|---|---|---|
| 2002/0081025 A1* | 6/2002 | Wagman | ............... | G06T 1/0007 382/170 |
| 2003/0113008 A1 | 6/2003 | Schanz | | |
| 2008/0083816 A1* | 4/2008 | Leinbach | ............. | B23K 3/0638 228/102 |
| 2010/0143656 A1* | 6/2010 | Zu | ...................... | B23K 3/0638 428/172 |
| 2014/0210993 A1 | 7/2014 | Butler et al. | | |
| 2015/0045927 A1* | 2/2015 | Haugen | ................... | H05K 3/00 700/109 |
| 2015/0050418 A1* | 2/2015 | Greer | ................... | B23K 1/0016 427/9 |
| 2015/0210064 A1* | 7/2015 | Kim | ........................ | B41F 33/00 101/129 |
| 2016/0203592 A1* | 7/2016 | Amano | ................ | G01B 11/002 348/87 |
| 2017/0177997 A1 | 6/2017 | Karlinsky et al. | | |
| 2017/0273228 A1* | 9/2017 | Lim | ........................ | H05K 13/08 |
| 2017/0357895 A1 | 12/2017 | Karlinsky et al. | | |
| 2017/0364798 A1 | 12/2017 | Karlinsky et al. | | |
| 2018/0049356 A1* | 2/2018 | Mori | .................... | B23K 1/0016 |
| 2019/0114764 A1* | 4/2019 | Okuda | ................ | G01N 21/956 |
| 2019/0195939 A1* | 6/2019 | Noh | ........................ | B41F 15/26 |
| 2019/0200494 A1* | 6/2019 | Kim | ........................ | G01B 11/25 |
| 2019/0269017 A1* | 8/2019 | Lee | ........................ | H05K 3/1216 |

FOREIGN PATENT DOCUMENTS

| | | |
|---|---|---|
| JP | 3-148050 | 6/1991 |
| KR | 10-2007-0099994 | 10/2007 |
| KR | 10-2017-0074812 | 6/2017 |

OTHER PUBLICATIONS

Hilario Haruomi Kobayashi et al., "Hybrid Defect detection Method Based on the Shape Measurement and Feature Extraction for Complex Patterns"; IEICE Trans. Inf. & Syst. vol. E83-D, No. 7., Jul. 2000, pp. 1338-1345.

Madhav Moganti et al.; "A Subpattern Level Inspection System for Printed Circuit Boards"; Computer Vision and Image Understanding vol. 70, No. 1, Apr. 1998, pp. 51-62.

European Search Report for European Application No. 17210425, dated Sep. 5, 2018.

Korean Office Action, with English translation, corresponding to Application No. 10-2017-0177391, dated Nov. 28, 2019.

Chinese Office Action, with English translation, corresponding to Chinese Application No. or Publication No. 201711405588.9, dated May 7, 2020.

* cited by examiner

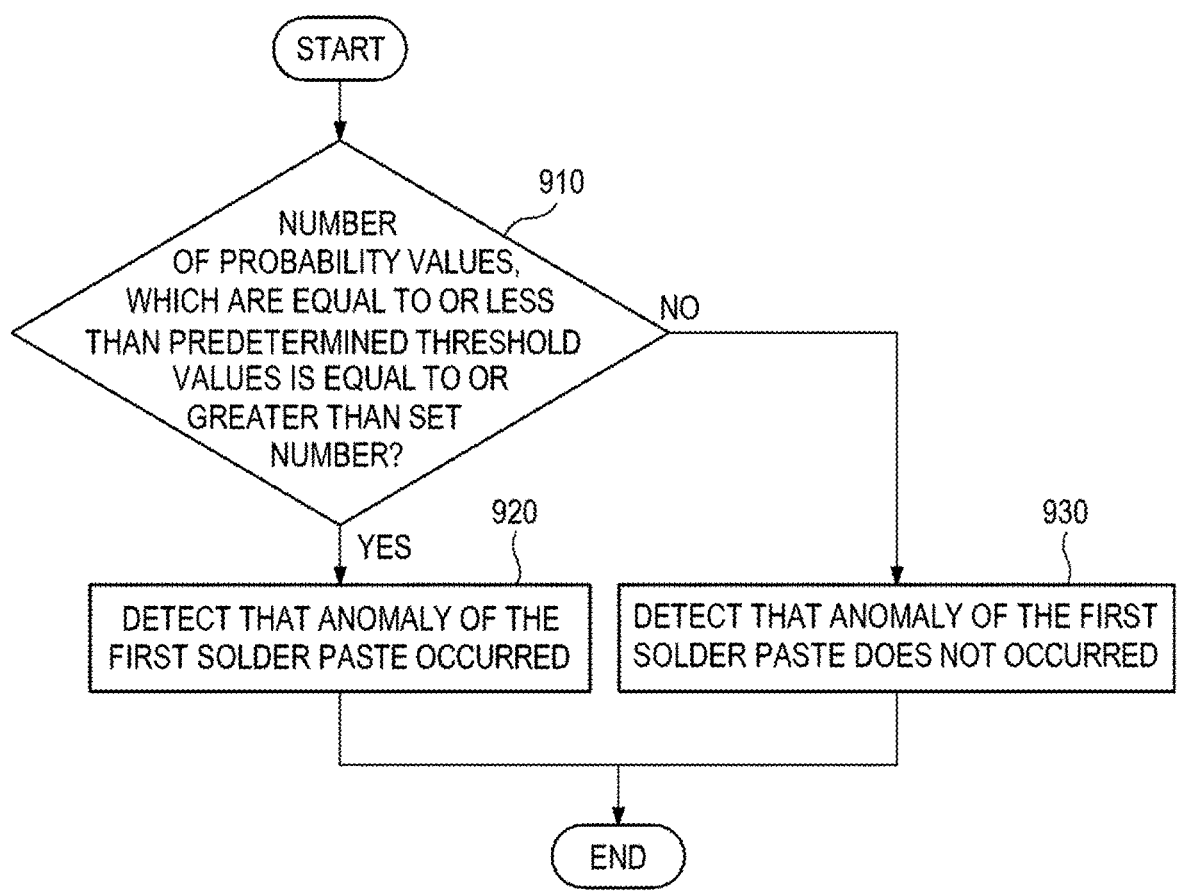

PRINTED CIRCUIT BOARD INSPECTING APPARATUS, METHOD FOR DETECTING ANOMALY IN SOLDER PASTE AND COMPUTER READABLE RECORDING MEDIUM

TECHNICAL FIELD

The present disclosure relates to a printed circuit board inspection apparatus and, more particularly, to a printed circuit board inspection apparatus for detecting an anomaly in at least one solder paste printed on a printed circuit board.

The present disclosure is derived from research carried out as part of the Robot industry convergence core technology of the Ministry of Trade, Industry and Energy [Project No.: 10077589, Project title: Development of SMT optimization system based on machine learning].

BACKGROUND ART

Solder paste is printed on a printed circuit board that is mounted on an electronic device by a screen printer and the process of printing solder paste on a printed circuit board using a screen printer is as follows. A screen printer loads a printed circuit board on a table for fixing the printed circuit board and aligns a stencil on the printed circuit board with the apertures of the stencil on the pad of the printed circuit board. Thereafter, the screen printer prints the solder paste onto the printed circuit board by depositing the solder paste through the apertures of the stencil using a squeegee. The screen printer then separates the stencil and the printed circuit board from each other.

The shape of solder pastes printed on a printed circuit board may be inspected through SPI (Solder Paste Inspection). SPI is a technique that obtains a 2D or 3D image of the solder pastes printed on the printed circuit board through an optical technology and inspects the shape of solder pastes printed on the printed circuit board from the obtained image.

SUMMARY

The present disclosure provides a printed circuit board inspection apparatus that may detecting, through the use of machine-learning based model, an anomaly in at least one solder paste printed on a printed circuit board.

The present disclosure provides a computer-readable recording medium having a program including executable instructions for enabling a printed circuit board inspection apparatus to detect, through the machine-learning based model, an anomaly in at least one solder paste printed on a printed circuit board.

The present disclosure provides a method for detecting an anomaly in at least one solder paste printed on a printed circuit board using a machine-learning based model in a printed circuit board inspection apparatus.

An embodiment of the present disclosure provides a printed circuit board inspection apparatus comprising: a memory configured to store a machine-learning based model configured to derive a probability value that each of two solder pastes have measurement shape information about each of the two solder paste when the two solder pastes are printed on a printed circuit board through two apertures having a predetermined aperture shape, which are formed in a stencil, using aperture shape information of the two apertures and the measurement shape information about each of the two solder pastes and a processor electrically connected with the memory, wherein the processor configured to obtain measurement shape information about each of a plurality of solder pastes printed on a first printed circuit board through a plurality of apertures formed in the stencil and aperture shape information about each of the plurality of apertures, obtain probability values that a first solder paste printed through a first aperture of the plurality of apertures and each of a plurality of second solder pastes printed through second apertures other than the first aperture of the plurality of apertures have the measurement shape information when the first solder paste and the plurality of second solder pastes are printed on the first printed circuit board, by applying the obtained measurement shape information and the obtained aperture shape information to the machine-learning based model, and detect whether an anomaly in the first solder paste occurred based on the obtained probability values.

In an embodiment, the measurement shape information includes at least one of volume information, height information, and area information of a solder paste.

In an embodiment, the machine-learning based model is learned to derive a probability value that the each of the two solder pastes have the measurement shape information about each of the two solder pastes when the two solder pastes are printed on the printed circuit board through the two apertures based on first information indicating previously learned distribution of measurement shape information about solder pastes printed through each of the plurality of aperture.

In an embodiment, the machine-learning based model derives the probability value that the first solder paste and each of the plurality of solder pastes have the measurement shape information when the first solder paste and the plurality of solder pastes are printed on the first printed circuit board based on the first information.

In an embodiment, the machine-learning based model is learned to derive a probability value that each of the two solder pastes have the measurement shape information about each of the two solder pastes when the two solder pastes are printed on the printed circuit board through the two apertures based on second information indicating previously learned distribution about a difference between measurement shape information of each of a plurality of solder pastes.

In an embodiment, the machine-learning based model derives the probability value that the first solder paste and each of the plurality of solder pastes have the measurement shape information when the first solder paste and the plurality of solder pastes are printed on the first printed circuit board based on the second information.

In an embodiment, the processor detects that the anomaly in the first solder paste occurred, when the number of probability values, which are equal to or less than a predetermined threshold value, of the obtained probability values is equal to or greater than a set number.

In an embodiment, the processor detects that the anomaly in the first solder paste does not occurred, when the number of probability values, which are less than a predetermined threshold value, of the obtained probability values is less than a set number.

In an embodiment, a printed circuit board inspection apparatus further comprising: an image sensor configured to obtain an image of the first printed circuit board, wherein the processor obtains the measurement shape information about each of a plurality of solder pastes printed on the first printed circuit board from the image obtained by the image sensor, and obtains the aperture shape information about each of the plurality of apertures through design information related to the first printed circuit board.

An embodiment of the present disclosure provides a non-transitory computer-readable recording medium having a program to be executed by a computer, wherein the program includes executable instructions that instruct a processor, when the program is executed by the processor, to perform: obtaining measurement shape information about each of a plurality of solder pastes printed on a first printed circuit board through a plurality of apertures formed in the stencil and aperture shape information about each of the plurality of apertures, obtaining probability values that a first solder paste printed through a first aperture of the plurality of apertures and each of a plurality of second solder pastes printed through second apertures other than the first aperture of the plurality of apertures have the measurement shape information when the first solder paste and the plurality of second solder pastes are printed on the first printed circuit board, by applying the obtained measurement shape information and the obtained aperture shape information to a machine-learning based model, and detecting whether an anomaly in the first solder paste occurred based on the obtained probability values, and wherein the machine-learning based model is derive a probability value that each of two solder pastes have measurement shape information about each of the two solder paste when the two solder pastes are printed on a printed circuit board through two apertures having a predetermined aperture shape, which are formed in a stencil, using aperture shape information of the two apertures and the measurement shape information about each of the two solder pastes.

In an embodiment, the measurement shape information includes at least one of volume information, height information, and area information of a solder paste.

In an embodiment, the machine-learning based model is learned to a probability value that the each of the two solder pastes have the measurement shape information about each of the two solder pastes when the two solder pastes are printed on the printed circuit board through the two apertures based on first information indicating previously learned distribution of measurement shape information about solder pastes printed through each of the plurality of aperture.

In an embodiment, the machine-learning based model derives the probability value that the first solder paste and each of the plurality of solder pastes have the measurement shape information when the first solder paste and the plurality of solder pastes are printed on the first printed circuit board based on the first information In an embodiment, the machine-learning based model is learned to derive a probability value that each of the two solder pastes have the measurement shape information about each of the two solder pastes when the two solder pastes are printed on the printed circuit board through the two apertures based on second information indicating previously learned distribution about a difference between measurement shape information of each of a plurality of solder pastes.

In an embodiment, the machine-learning based model derives the probability value that the first solder paste and each of the plurality of solder pastes have the measurement shape information when the first solder paste and the plurality of solder pastes are printed on the first printed circuit board based on the second information.

In an embodiment, the detecting whether an anomaly in the first solder paste occurred includes detecting that the anomaly in the first solder paste occurred, when the number of probability values, which are equal to or less than a predetermined threshold value, of the obtained probability values is equal to or greater than a set number.

An embodiment of the present disclosure provides A method for detecting an anomaly in a solder paste by a printed circuit board inspection apparatus, the method comprising: obtaining measurement shape information about each of a plurality of solder pastes printed on a first printed circuit board through a plurality of apertures formed in the stencil and aperture shape information about each of the plurality of apertures, obtaining probability values that a first solder paste printed through a first aperture of the plurality of apertures and each of a plurality of second solder pastes printed through second apertures other than the first aperture of the plurality of apertures have the measurement shape information when the first solder paste and the plurality of second solder pastes are printed on the first printed circuit board, by applying the obtained measurement shape information and the obtained aperture shape information to a machine-learning based model, and detecting whether an anomaly in the first solder paste occurred based on the obtained probability values, and wherein the machine-learning based model is derive a probability value that each of two solder pastes have measurement shape information about each of the two solder paste when the two solder pastes are printed on a printed circuit board through two apertures having a predetermined aperture shape, which are formed in a stencil, using aperture shape information of the two apertures and the measurement shape information about each of the two solder pastes.

The printed circuit board inspection apparatus of various embodiments according to the present disclosure may detect whether an anomaly in each of a plurality of solder pastes printed on a printed circuit board occurred, using measurement shape information about the plurality of solder pastes printed on the printed circuit board and aperture shape information of apertures of a stencil. Accordingly, it is possible to more accurately determine whether the anomaly in each of the plurality of solder pastes printed on a printed circuit board occurred.

BRIEF DESCRIPTION OF THE DRAWINGS

The above and other aspects, features and advantages of the present disclosure will be more apparent from the following detailed description taken in conjunction with the accompanying drawings, in which:

FIG. 9 is a flowchart indicating a method of determining whether an anomaly in a solder paste occurred using probability values derived by a machine-learning based model according to various embodiments of the present disclosure.

Figure 1:
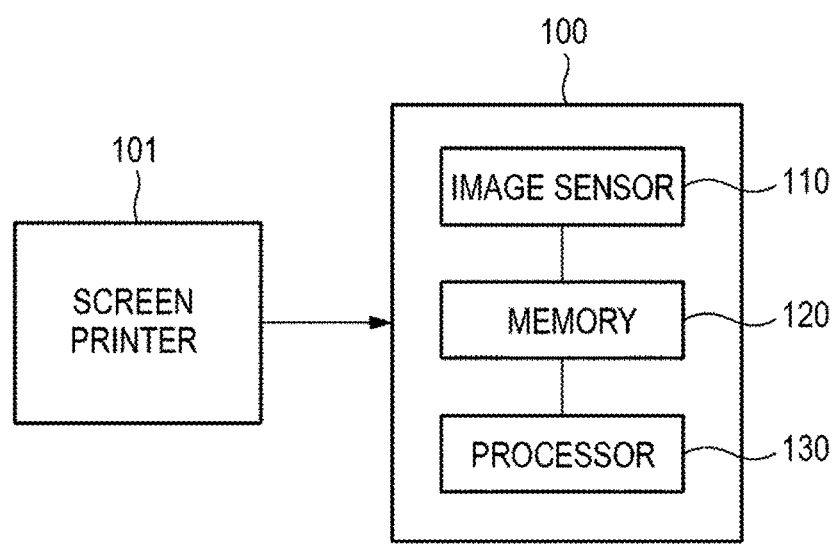
FIG. 1 is a block diagram of a printed circuit board inspection apparatus according to various embodiments of the present disclosure.

The printed circuit board inspection apparatus of various embodiments according to the present disclosure may obtain probability values that a plurality of solder pastes have the obtained measurement shape information, using measurement shape information about a plurality of solder pastes printed on a printed circuit board and aperture shape information of apertures of a stencil, and may determine an anomaly in the solder pastes occurred on the basis of the obtained probability values. Accordingly, it is possible to more accurately determine whether the anomaly on the solder pastes printed on a printed circuit board occurred.

DETAILED DESCRIPTION

Embodiments described herein are provided as examples for explaining the spirit of the present disclosure. The scope of the present disclosure is not limited to the following embodiments or the detailed description of the embodiments.

In the flowing description, unless otherwise defined, all terms including technical and scientific terms used herein have the same meaning as commonly understood by those skilled in the art to which this invention belongs. All terms used herein are selected not to limit the scope of the present disclosure, but to make the present disclosure clearer.

The terms "comprise", "include", "have", etc. used herein should be understood as open-ended terms implying the possibility of including other embodiments, unless stated otherwise in phrases and sentences including the terms.

The singular forms "a," "an" and "the" are intended to include the plural forms as well, unless the context clearly indicates otherwise, and which will be applied in the same way to those in claims.

Terms such as 'first', 'second', etc. are used only for the purpose of distinguishing a plurality of constitutive elements from other constitutive elements, rather than to limit the order or priority of the constitutive elements.

The expressions 'based on' and 'on the basis of' used herein are used to describe at least one factor influencing decisions, determinations, or operations stated in phrases or sentences including the expressions, without excluding additional factors influencing such decisions, determinations, or operations.

It will be understood that when an element is referred to as being "coupled" or "connected" to another element in the present disclosure, it may be directly coupled or connected to the other element, or intervening elements may be present therebetween.

Hereafter, embodiments of the present disclosure are described with reference to the accompanying drawings. The same or corresponding components are given the same reference numerals in the accompanying drawings. Further, repeated description of the same or corresponding components may be omitted in the following description of the embodiments. However, omission of a description of components is not intended to mean exclusion of the components from the embodiments.

FIG. 1 is a block diagram of a printed circuit board inspection apparatus according to various embodiments of the present disclosure.

According to an embodiment of the present disclosure, a printed circuit board inspection apparatus 100 may include an image sensor 110, a memory 120, and a processor 130. Further, the printed circuit board inspection apparatus 100 may further include another output device (not shown) such as a display for outputting a result processed by the processor 130 and or a communication circuit (not shown) for transmitting the processed result to another electronic device. The image sensor 110, memory 120, and processor 130 are electrically connected to each other, so they may transmit/receive signals.

In an embodiment, the image sensor 110 may obtain an image of a printed circuit board printed with a plurality of solder pastes by a screen printer 101. The image obtained by the image sensor 110 may be a 2D or 3D image of the printed circuit board. The image of the printed circuit board obtained by the image sensor 110 may be used to measure shape information about the solder pastes printed on the printed circuit board. Hereinafter, the shape information on the plurality of solder pastes measured will be referred to as 'measurement shape information'. For example, the measurement shape information including at least one of the volume information, area information, and height information of each of the solder pastes printed on the printed circuit board may be measured, using the image of the printed circuit board. However, these examples are provided merely for explanation and the information is not limited thereto, and various information relating to the shape of each of a plurality of solder pastes may be measured. Further, various information that may indicate the characteristics of a plurality of solder pastes such as the positions of each of a plurality of solder pastes printed on the printed circuit board may be further measured, using the image of the printed circuit board.

In an embodiment, the memory 120 may store a machine-learning based model. The machine-learning-base model may derive a probability value that each of two solder pastes have the obtained measurement shape information about each of the two solder paste when the two solder pastes are printed on a printed circuit board through two apertures having a predetermined aperture shape, which are formed in a stencil, using aperture shape information of the two apertures and the measurement shape information about each of the two solder pastes. Here, the aperture shape information may include information related to the characteristics of the two apertures such as the shape, size, thickness, etc. of the two apertures formed in the stencil The measurement shape information of a plurality of solder pastes printed on a printed circuit board may be different according to a control parameter of the screen printer 101, the shapes of the apertures of the stencil used for printing on the printed circuit board, and the environmental factors associated with the operation of the screen printer 101. The control parameter of the screen printer 101 and the environmental factors associated with the operation of the screen printer 101 may be constant for one printed circuit board to be printed with a plurality of solder pastes by the screen printer 101. Therefore, the measurement shape information of solder pastes printed on one printed circuit board may be different according to the shapes of the apertures of the stencil used for printing on the printed circuit board.

Accordingly, in order to derive the probability value that each of two solder pastes have measurement shape information about each of the two solder paste when the two solder pastes are printed on a printed circuit board through two apertures having a predetermined aperture shape, the machine-learning based model may be learned to derive the probability value that each of two solder pastes have measurement shape information about each of the two solder paste when the two solder pastes are printed on a printed circuit board through two apertures having a predetermined aperture shape, using the measurement shape information about a plurality of solder pastes printed on a plurality of printed circuit boards inspected by the printed circuit board inspection apparatus 100 and the aperture shape information about a plurality of apertures formed in the stencil used for printing on the printed circuit boards. A deep-learning model may be used as the machine-learning based model and a method of performing learning on the machine-learning based model will be described below.

Further, the machine-learning based model may be stored in a memory of an electronic apparatus (ex, external server, etc.) connected to the printed circuit board inspection apparatus 100. In this case, the printed circuit board inspection apparatus 100 may communicate information for detecting whether an anomaly in solder pastes occurred with the electronic apparatus connected to the printed circuit board inspection apparatus 100.

In an embodiment, the processor 130 may use the measurement shape information about each of a plurality of solder pastes printed through a plurality of apertures formed in the stencil used for printing on a printed circuit board and the measurement shape information of the apertures from the machine-learning based model in order to derive a probability value that each of two solder pastes have measurement shape information about each of the two solder paste when the two solder pastes are printed on a printed circuit board through two apertures having a predetermined aperture shape. For example, the measurement shape information about each of a plurality of solder pastes may be obtained from an image of a printed circuit board. Further, the measurement shape information of a plurality of apertures may be obtained from design information related to a printed circuit board. The design information related to a printed circuit board may include the information about the stencil used for printing on the printed circuit board (for example, the number, the shape, the position etc. of the aperture formed in the stencil).

For example, the processor 130 may obtain the measurement shape information about each of a plurality of solder pastes printed on a first printed circuit board on the basis of a plurality of apertures formed in the stencil used for printing on the first printed circuit board in the screen printer 101. The first printed circuit board may be a printed circuit board that is printed with a plurality of solder pastes in the screen printer 101 and is then conveyed to the printed circuit board inspection apparatus 100 as an object to be inspected. For example, the processor 130 may obtain the measurement shape information about each of a plurality of solder pastes printed on the first printed circuit board using the image of the first printed circuit board.

Further, the processor 130 may obtain the aperture shape information of a plurality of apertures formed in the stencil used for printing on the first printed circuit board. The processor 130 may obtain the aperture shape information of the apertures from the design information related to the first printed circuit board stored in the memory 120 or received from the screen printer 101.

In an embodiment, the processor 130 may apply the measurement shape information about each of the solder pastes printed on the first printed circuit board and the aperture shape information of each of the apertures formed in the stencil used for printing on the first printed circuit board to the machine-learning based model. The processor 130 may obtain the probability value that each of two solder pastes have measurement shape information about each of the two solder paste when the two solder pastes are printed on a printed circuit board through two apertures having a predetermined aperture shape, derived from the machine-learning based model.

For example, the processor 130 may obtain probability values that a first solder paste printed through a first aperture of the plurality of apertures and each of a plurality of second solder pastes printed through second apertures other than the first aperture of the plurality of apertures have the obtained measurement shape information when the first solder paste and the plurality of second solder pastes are printed on the first printed circuit board.

In an embodiment, the processor 130 may detect whether an anomaly in the first solder paste occurred based on the probability values obtained from the machine-learning based model. For example, when the number of probability values, which are equal to or less than a predetermined threshold value, of the obtained probability values is equal to or greater than a set number, the processor 130 may detect that an anomaly in the first solder paste occurred. Alternatively, when the number of probability values, which are less than a predetermined threshold value, of the obtained probability values is less than the set number, the processor 130 may detect that the anomaly in the first solder paste does not occurred. The threshold value and the number that are used for detecting whether the anomaly in the first solder paste occurred may be adjusted by comparing the detection result with whether the anomaly in the first solder paste is actually occurred after the detection of whether the anomaly in the first solder paste occurred.

In an embodiment, the processor 130, after detecting whether an anomaly in the first solder paste occurred, may perform the same process on the other solder pastes other than the first solder paste in the solder pastes printed on the first printed circuit board. Accordingly, the processor 130 may detect whether an anomaly in at least one solder paste of a plurality of solder pastes printed on the first printed circuit board occurred.

In an embodiment, the measurement shape information about each of the solder pastes printed on the first printed circuit board and the aperture shape information of the apertures formed in the stencil used for printing on the first printed circuit board may be used for detecting whether an anomaly in at least one of solder paste of the plurality of solder pasted printed on the first printed circuit board occurred. Accordingly, the values derived from the machine-learning based model may become more exact, as the number of printed circuit boards inspected by the printed circuit board inspection apparatus 100 increase.

Figure 2:
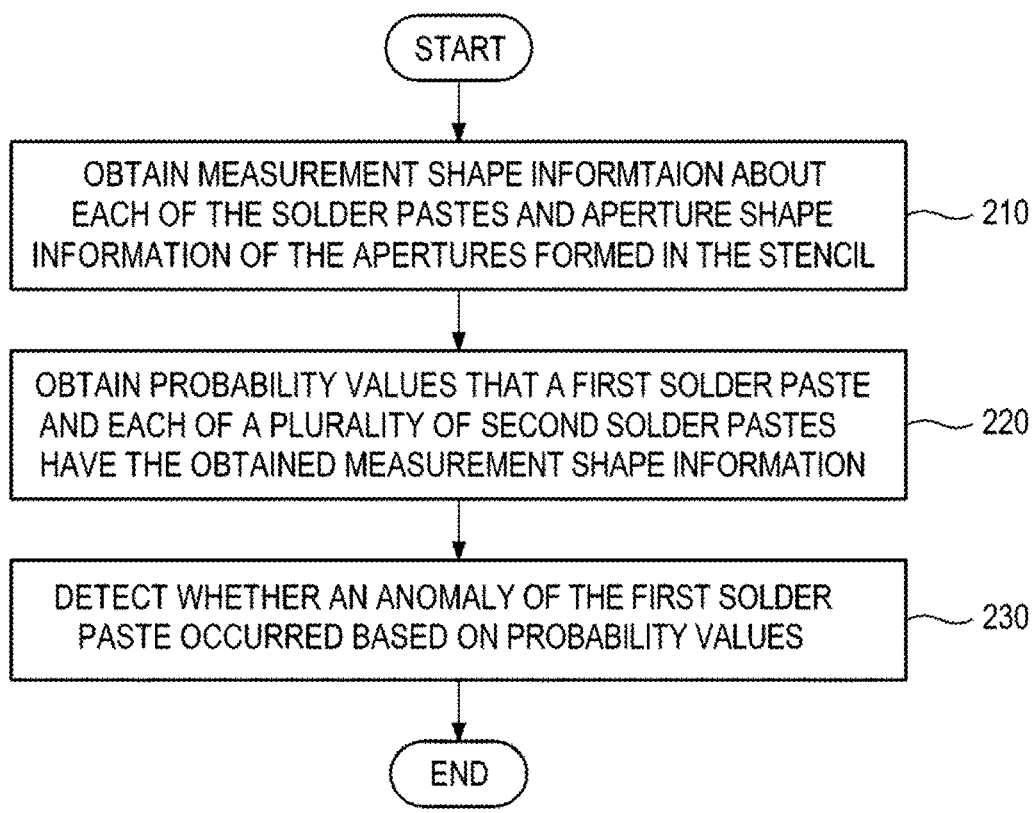
FIG. 2 is a flowchart of a method of detecting whether an anomaly in solder pastes printed on a printed circuit board occurred, according to various embodiments of the present disclosure.

FIG. 2 is a flowchart of a method of detecting whether an anomaly in solder pastes printed on a printed circuit board occurred, according to various embodiments of the present disclosure.

Process steps, method steps, and algorithms are sequentially illustrated in the flowcharts of FIGS. 2, 6, 7, 8 and 9 but the processes, methods, and algorithms may be performed in a predetermined sequence as appropriate. In other words, the steps of processes, methods, and algorithms described in various embodiments of the present disclosure are not necessarily performed in the sequence described herein. Further, although some steps are described as being non-simultaneously performed, they may be simultaneously performed in another embodiment. Further, examples of processes shown in the drawings do not mean that the exemplary processes exclude other changes and modifications, do not mean that some of the exemplary processes or the steps of the processes are necessary in one of various embodiments of the present disclosure, and do not mean that the exemplary processes are preferable.

In step 210, the processor 130 of the printed circuit board inspection apparatus 100 may obtain measurement shape information about each of the solder pastes printed on the first printed circuit board using an image of the first printed circuit board. Further, the processor 130 may obtain the aperture shape information of the apertures formed in the stencil used for printing on the first printed circuit board. The processor 130 may obtain the aperture shape information of the apertures from the design information related to the first printed circuit board stored in the memory 120 or received from an external electronic device such as a screen printer 101.

In step 220, the processor 130 may obtain probability values that a first solder paste printed through a first aperture of the plurality of apertures and each of a plurality of second solder pastes printed through second apertures other than the first aperture of the plurality of apertures have the obtained measurement shape information when the first solder paste and the plurality of second solder pastes are printed on the first printed circuit board, by applying the obtained measured measurement shape information about each of the solder pastes and the obtained aperture shape information of the apertures to the machine-learning based model. The method in which the machine-learning based model derives the probability value that the first solder paste and each of the plurality of second solder pasted have the obtained measurement shape information is described below.

In step 230, the processor 130 may detect whether an anomaly in the first solder paste occurred based on the probability values obtained from the machine-learning based model. Further, the processor 130, after detecting whether the anomaly in the first solder paste occurred, may perform steps 220 and 230 on the other solder pastes other than the first solder paste in the plurality of solder pastes printed on the first printed circuit board. Accordingly, the processor 130 may detect whether an anomaly in at least one solder paste of the plurality of solder pastes printed on the first printed circuit board occurred.

Figure 3:
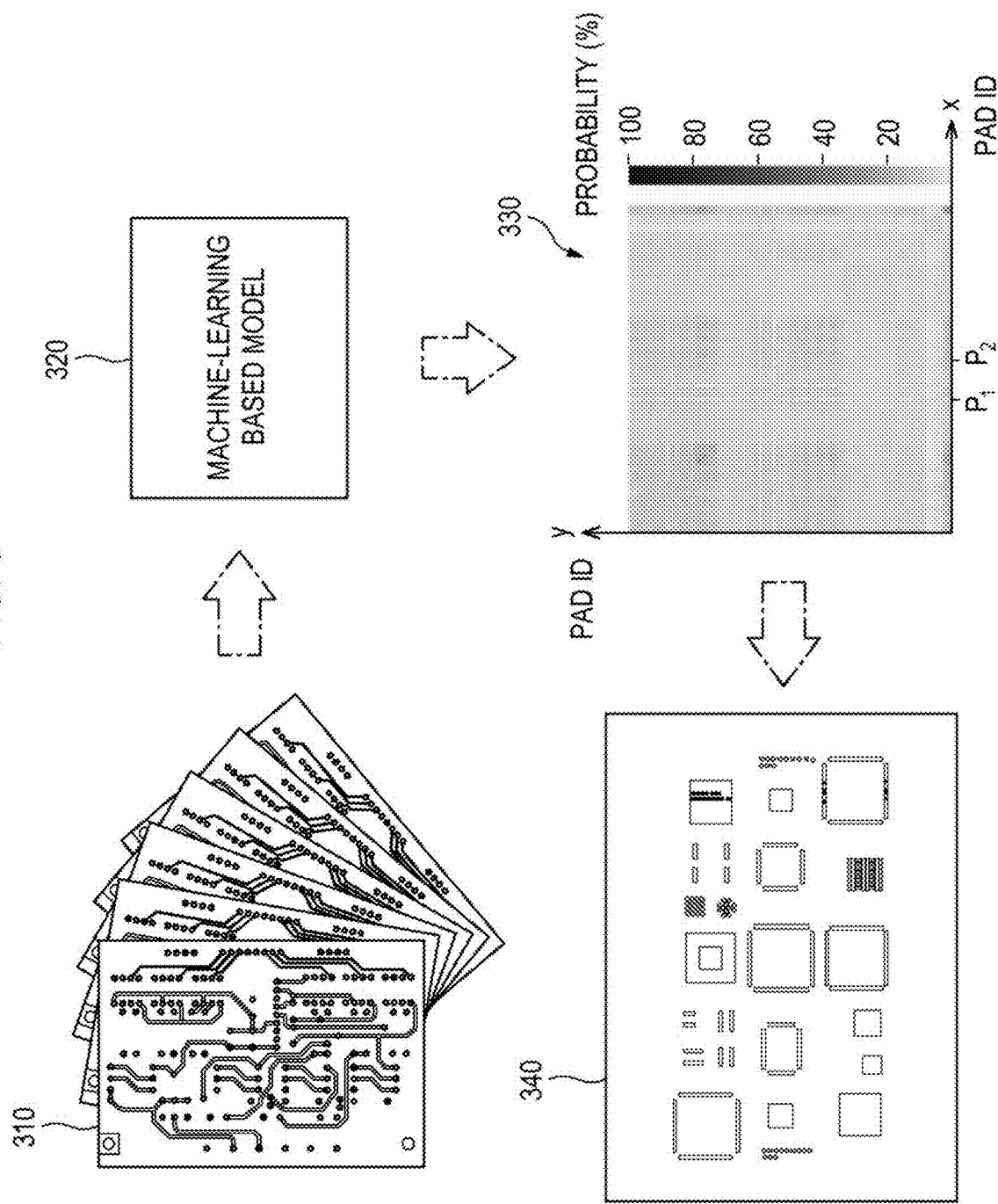
FIG. 3 is a conceptual diagram indicating a method in which the printed circuit board inspection apparatus detects whether an anomaly in each of a plurality of solder pastes occurred, according to various embodiments of the present disclosure.

FIG. 3 is a conceptual diagram indicating a method in which the printed circuit board inspection apparatus detects whether an anomaly in each of a plurality of solder pastes occurred, according to various embodiments of the present disclosure.

In an embodiment, a plurality of solder pastes are printed on each of a plurality of printed circuit boards 310 by the screen printer 101 and then the plurality of printed circuit boards 310 may be conveyed to the printed circuit board inspection apparatus 100. The printed circuit boards 310 are sequentially conveyed to the printed circuit board inspection apparatus 100 and the printed circuit board inspection apparatus 100 may detect whether an anomaly in at least one solder paste of the plurality of solder pastes printed on each of the printed circuit boards 310 occurred.

In an embodiment, a machine-learning based model 320 stored in the memory 120 of the printed circuit board inspection apparatus 100 or stored in a memory of an electronic apparatus connected to the printed circuit board inspection apparatus 100 may derive probability values that a first solder paste printed through a first aperture of the plurality of apertures and each of a plurality of second solder pastes printed through second apertures other than the first aperture of the plurality of apertures have the obtained measurement shape information when the first solder paste and the plurality of second solder pastes are printed on the first printed circuit board. For example, the machine-learning based model 320 may derive probability values that each of the plurality of solder pastes printed on the first printed circuit board of the plurality of printed circuit boards 310 and each of the other solder pastes have the obtained measurement shape information. The probability values derived from the machine-learning based model 320 may be used for the processor 130 to detect whether an anomaly in at least one solder paste of the plurality of solder pastes printed on the first printed circuit board.

In an embodiment, the probability values derived from the machine-learning based model 320 corresponding to each of a plurality of solder pastes may be shown as in a graph 330. The x-axis and y-axis in the graph 330 may be pad IDs of the first printed circuit board on which the solder pastes are printed. For example, referring to the graph 330, the probability values that a first solder paste printed on a first pad corresponding to a first pad ID P1 and the solder pastes printed on the other pads other than the first pad in the pads of the first printed circuit board have the obtained measurement shape information may be relatively low and may be similar values to each other. Accordingly, the first solder paste printed on the first pad may be detected as having an anomaly.

Alternatively, referring to the graph 330, the probability values that a second solder paste printed on a second pad corresponding to a second pad ID P2 and the solder pastes printed on the other pads other than the second pad in the pads of the first printed circuit board have the obtained measurement shape information may be relatively high and may be similar values to each other. Accordingly, the second solder paste printed on the second pad may be detected as having no anomaly.

In an embodiment, a threshold value that is the reference for determining that the values shown in the graph are relatively high or low may be adjusted by comparing the detection result with whether the anomaly in a solder paste is actually occurred after the detection of whether the anomaly in the solder paste occurred. For example, when a solder paste is detected as having an anomaly and the solder paste detected having the anomaly actually has the anomaly, the threshold value may be maintained or adjusted to be lower. Alternatively, when a solder paste is detected as having the anomaly and the solder paste detected having the anomaly actually has no anomaly, the threshold value may be adjusted to be higher.

In an embodiment, the probability values that a solder paste and each of the other solder pastes have the obtained measurement shape information may be distributed close to a set threshold value. In this case, in order to detect whether an anomaly in a solder paste occurred, whether the anomaly in the solder paste occurred is detected by comparing the number of probability values, which are equal to or lower than the threshold value, of the probability values and a set number.

For example, when the number of probability values, which are equal to or lower than the threshold value, is equal to or greater than the set number, the solder paste is detected as having an anomaly, and when the number of probability values, which are less than the threshold values, is less than the set number, the solder paste may be detected as having no anomaly. The number that is the reference for detecting whether an anomaly in a solder paste occurred may also be adjusted by comparing the detection result with whether the anomaly in a solder paste is actually occurred after the detection of whether the anomaly in the solder paste occurred. For example, when a solder paste is detected as having an anomaly and the solder paste detected having the anomaly actually has the anomaly, the number may be maintained or adjusted to be lower. Alternatively, when a solder paste is detected as having the anomaly and the solder paste detected having the anomaly actually has no anomaly, the number may be adjusted to be higher.

In an embodiment, in the plurality of solder pastes printed on the first printed circuit board, at least one solder paste detected as having an anomaly based on the values derived from the machine-learning based model 320 may be shown in the image 340 of the first printed circuit board. For example, the pad IDs corresponding to at least one solder pastes having the anomaly is determined and the printed positions of the at least one solder paste having the anomaly is determined through the determined pad IDs and the design information related to the first printed circuit board.

In an embodiment, the image 340 of the first printed circuit board in which at least one solder pastes having the anomaly are indicated may be output through the display of the printed circuit board inspection apparatus 100. Further, the image 340 of the first printed circuit board in which the solder pastes having the anomaly are indicated may be transmitted to another electronic device through the communication module of the printed circuit board inspection apparatus 100 and used to determine and correct defects, which are associated with the at least one solder paste having the anomaly, of the screen printer 101.

Figure 4:
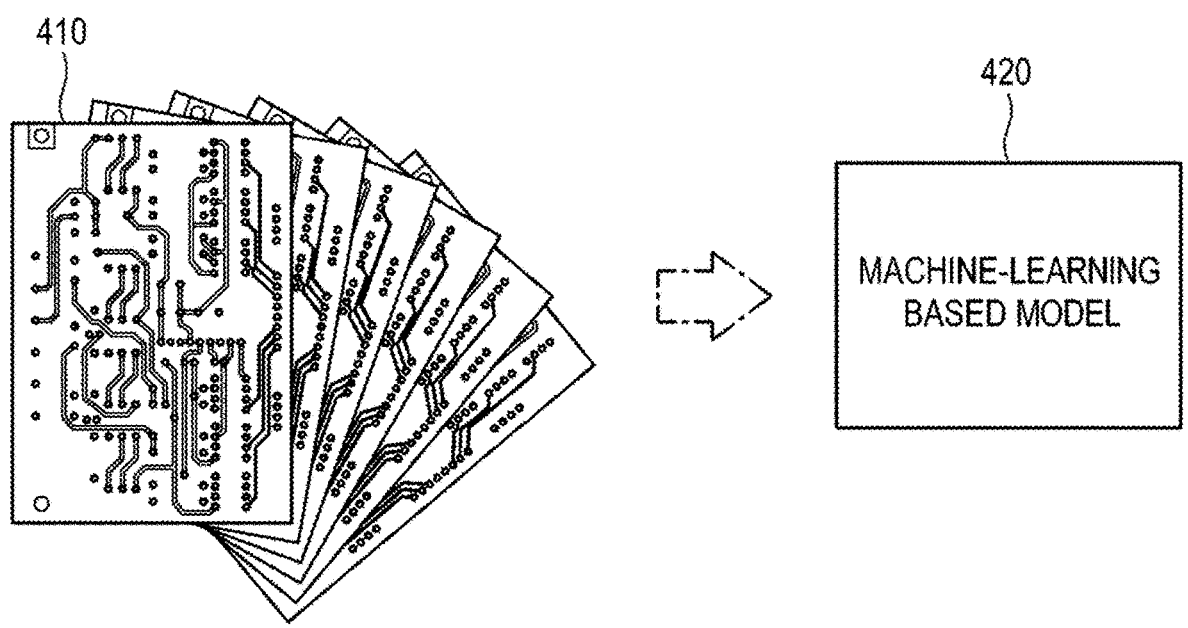
FIG. 4 is a conceptual diagram indicating a method in which the printed circuit board inspection apparatus performs learning on a machine-learning based model according to various embodiments of the present disclosure.

FIG. 4 is a conceptual diagram indicating a method in which the printed circuit board inspection apparatus performs learning on a machine-learning based model according to various embodiments of the present disclosure.

In an embodiment, in order to derive the probability values that each of a plurality of solder pastes and each of the other solder pastes have the obtained measurement shape information, a machine-learning based model 420 may be learned using the measurement shape information about a plurality of solder pastes printed on a plurality of printed circuit boards 410 inspected by the printed circuit board inspection apparatus 100 and the aperture shape information about a plurality of apertures formed in the stencil used for printing on the printed circuit boards.

For example, since the control parameter of the screen printer 101 and the environmental factors related to the operation of the screen printer 101 are consistent, the shape of the apertures formed in the stencil used for printing on the printed circuit boards may mainly influence the measurement shape information of the plurality of solder pastes printed on one printed circuit board. Accordingly, the machine-learning based model 420 may be learned using the measurement shape information about the solder pastes and the aperture shape information of the apertures formed in the stencil.

In an embodiment, machine-learning based model 420 may be learned using the measurement shape information about the solder pastes and the aperture shape information of the apertures formed in the stencil regardless of the shape of the apertures formed in the stencil.

For example, machine-learning based model 420 may learn distribution information of measurement shape information about solder pastes printed on the same printed circuit board through each of the plurality of apertures. Machine-learning based model 420 may learn the distribution information of measurement shape information about solder pastes to correspond to each of a plurality of shapes of apertures formed in at least one stencil used in screen printer 101.

For example, machine-learning based model 420 may derive probability values that each of a plurality of solder pasted have the obtained measurement shape information when the plurality of solder pastes are printed on the same printed circuit board based on the distribution information indicating previously learned distribution of measurement shape information about solder pasted printed through each of a plurality of apertures.

Alternatively, machine-learning based model 420 may learn distribution information indicating previously learned distribution about a difference between measurement shape information of each of a plurality of solder pastes. Here, the difference between measurement shape information of each of a plurality of solder pastes may indicate a quantitative difference or the like.

Further, machine-learning based model 420 may derive probability values that each of a plurality of solder pasted have the obtained measurement shape information when the plurality of solder pastes are printed on the same printed circuit board based on the distribution information indicating previously learned distribution about a difference between measurement shape information of each of a plurality of solder pastes.

As described above, machine-learning based model 420 may derive probability values that each of a plurality of solder pasted have the obtained measurement shape information when the plurality of solder pastes are printed on the same printed circuit board using the distribution information indicating previously learned distribution about a difference between measurement shape information of each of a plurality of solder pastes and the distribution information indicating previously learned distribution of measurement shape information about solder pasted printed through each of a plurality of apertures regardless of the shape of the apertures formed in the stencil.

As another example, machine-learning based model 420 may derive probability values that each of a plurality of solder pasted have the obtained measurement shape information when the plurality of solder pastes are printed on the same printed circuit board in different ways depending on whether the shapes of the apertures are the same. This will be described below.

In an embodiment, when two apertures formed in the stencil have the same shape, the machine-learning based model 420 may learn distribution information about measurement shape information of solder pastes printed through the apertures having the same shape, based on the measurement shape information of the two solder pastes printed on the same printed circuit board through the two apertures. The distribution information about the measurement shape information of solder pastes printed on the same printed circuit board through apertures having the same shape may be learned by the machine-learning based model 420 to correspond respectively to a plurality of shapes of apertures formed in at least one stencil used in the screen printer 101.

Figure 5A:
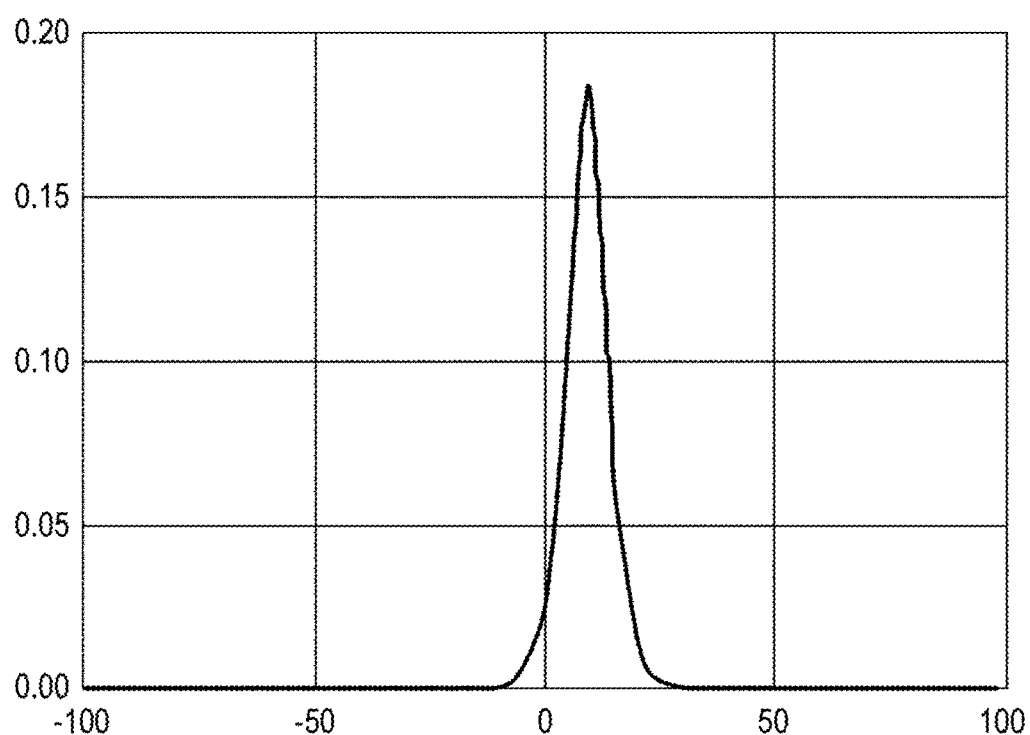
FIG. 5A is a graph indicating distribution of measurement shape information of a first solder paste printed through an aperture having a first shape according to various embodiments of the present disclosure.
Figure 5B:
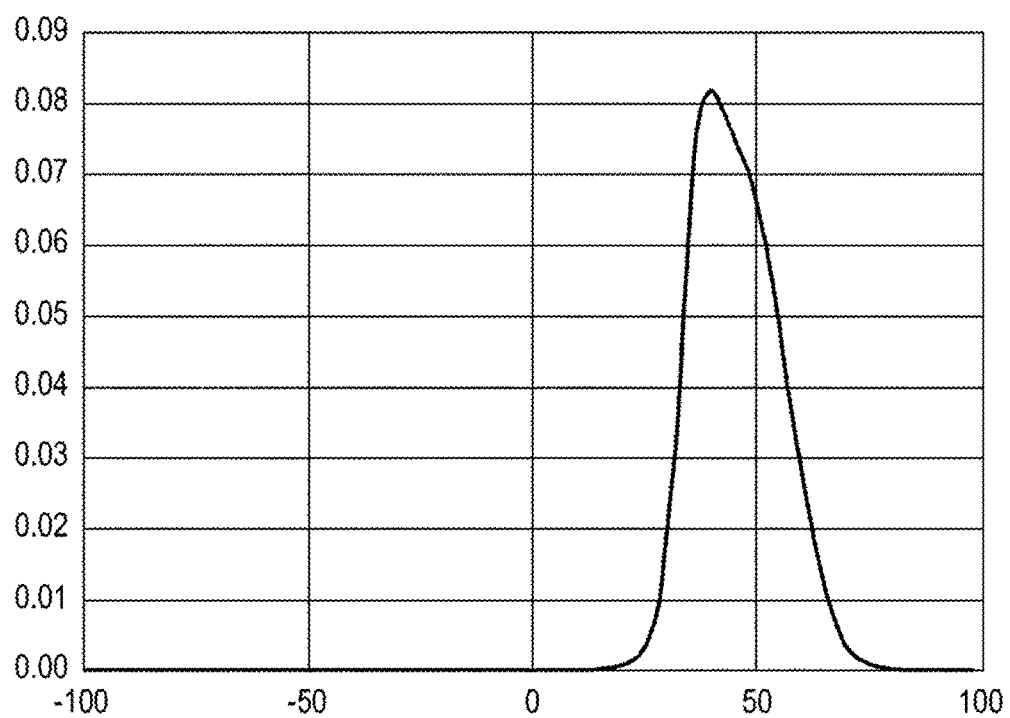
FIG. 5B is a graph indicating distribution of measurement shape information of a second solder paste printed through an aperture having a second shape according to various embodiments of the present disclosure.

For example, the distribution information about the measurement shape information of solder pastes printed through two apertures formed in a stencil to have a first shape and a second shape may be shown in Gaussian distribution, as in FIGS. 5A and 5B. This distribution information may be used for the machine-learning based model 420 to derive the probability values that solder pastes have the obtained measurement shape information. Further, the distribution information may be used to derive a difference or a relative value of measurement shape information of solder pastes printed through apertures having different shapes.

In an embodiment, when two aperture formed in a stencil both have a first shape, the machine-learning based model 420 may be learned to derive a probability value that two solder pastes have the obtained measurement distribution information based on previously learned distribution information of the measurement shape information of solder pastes printed through apertures having the first shape. For example, the machine-learning based model 420 may derive a probability value that each of the two solder pastes have the obtained measurement shape information when the two solder pastes printed on the first printed circuit board to be inspected through the apertures having the first shape based on the distribution information.

For example, when the volume information of the two solder pastes printed through the apertures having the first shape is a and b, the machine-learning based model 420 may apply the volume information of the two solder pastes to the previously learned distribution information. The machine-learning based model 420 may derive a probability value that the solder pastes printed through the apertures having the first shape have the volume information a or b based on the distribution information. Although the volume information of the measurement shape information was exemplified above for the convenience of description, the present disclosure is not limited thereto and the probability value that each of the two solder pastes have the obtained measurement shape information when the two solder pastes printed on the first printed circuit board may be derived from other information included in the measurement shape information except for the volume information.

In an embodiment, when two apertures formed in the stencil are different in shape, the machine-learning based model 420 may learn distribution information about the difference of measurement shape information of two solder pastes based on the measurement shape information of the two solder pastes printed on the same printed circuit board through the two apertures. For each of a plurality of shapes of apertures formed in at least one stencil used in the screen printer 101, distribution information about the differences between the measurement shape information of solder pastes printed on the same printed circuit board through apertures having the same shape and the measurement shape information of solder pastes printed through apertures having different shapes may be learned by the machine-learning based model 420.

Figure 5C:
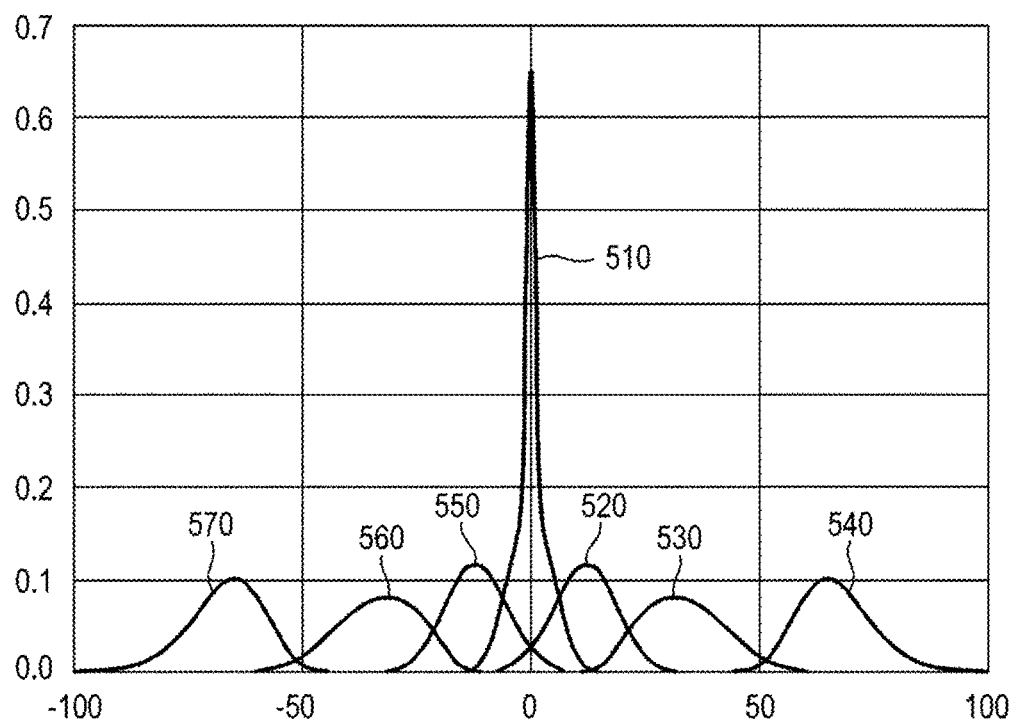
FIG. 5C is a graph indicating distribution information about the difference of measurement shape information between a first solder paste and a second solder paste according to various embodiment of the present disclosure.

For example, the distribution information about the differences between the measurement shape information about solder pastes printed through apertures formed in a stencil in the first shape and the measurement shape information about solder pastes printed through apertures having difference shapes may be shown as in FIG. 5C. For example, a first graph 510 may be the distribution information about the difference between the measurement shape information about a solder paste printed through an aperture having a first shape and the measurement shape information about a solder paste printed through an aperture having a second shape. A second graph 520 may be the distribution information about the difference between the measurement shape information about a solder paste printed through the aperture having the first shape and the measurement shape information about a solder paste printed through an aperture having a third shape. Third graph 530 to seventh graph 570 may also be the distribution information about the difference between the measurement shape information about a solder paste printed through the aperture having the first shape and the measurement shape information about solder pastes printed through an aperture having fourth to eighth shapes.

This distribution information may be used for the machine-learning based model 420 to derive the probability values that solder pastes printed through apertures having different shapes have the obtained measurement shape information.

For example, when the volume information of a first solder paste printed through the aperture having the first shape is a and the volume information of a second paste printed through the aperture having the second shape is b, the machine-learning based model 420 may derive a probability value that the first solder paste and the second solder paste have the volume information which is a and the volume information which is b through a conditional probability such as the following Equation 1 based on the distribution information.

$$x = P(A|B) \qquad \text{[Equation 1]}$$

where x may be the probability value that the first solder paste and the second solder paste have the volume information which is a and the volume information which is b, A may indicate an event in which the difference in the volume information between the first solder paste and the second solder paste is a-b, and B may indicate an event in which the first solder paste is printed through the aperture having the first shape and the second solder paste is printed through the aperture having the second shape. When the first solder paste is printed through the first aperture of the stencil and the second solder paste is printed through the second aperture, the machine-learning based model 420 may derive the probability value that the difference in the volume information between the first solder paste and the second solder paste is a-b based on the distribution information. The machine-learning based model 420 may derive the derived probability value as a probability value that the first solder paste and the second solder paste have the volume information which is a and the volume information which is b.

In an embodiment, when two apertures formed in the stencil are different in shape, the machine-learning based model 420 may learn distribution information about the relative value of measurement shape information of two solder pastes based on the measurement shape information of the two solder pastes printed on the same printed circuit board through the two apertures. For each of a plurality of shapes of apertures formed in at least one stencil used in the screen printer 101, distribution information about the relative value of the measurement shape information of solder pastes printed on the same printed circuit board through apertures having the same shape and the measurement shape information of solder pastes printed through apertures having different shapes may be learned by the machine-learning based model 420. The relative value may be may be a value indicating the relationship of the measurement shape information of two solder pastes such as the ratio of the measurement shape information of two solder pastes.

This distribution information may be used for the machine-learning based model 420 to derive the probability values that solder pastes printed through apertures having different shapes are have the obtained measurement shape information.

For example, when the volume information of a first solder paste printed through the aperture having the first shape is a and the volume information of a second paste printed through the aperture having the second shape is b, the machine-learning based model 420 may derive a probability that the first solder paste and the second solder paste have the volume information which is a and the volume information which is b through a conditional probability such as the following Equation 2 and based on the distribution information.

$$x = P(C|D) \qquad \text{[Equation 2]}$$

Where x may be a probability value that the first solder paste and the second solder paste have the volume information which is a and the volume information which is b. Further, C may indicate an event in which the ratio of the volume information of the first solder paste and the volume information of the second solder paste is a:b and D may indicate an event in which the first solder paste is printed through the aperture having the first shape and the second solder paste is printed through the aperture having the second shape. Further, C may indicate an case in which the volume information of the first solder paste is a and D may indicate an event in which the first solder paste is printed through the aperture having the first shape and the volume information of the second solder paste printed through the aperture having the second shape is b. When the first solder paste is printed through the aperture having the first shape and the volume information of the second solder paste printed through the aperture having the second shape is b, the machine-learning based model 420 may derive the probability value that the volume information of the first solder paste is a. The machine-learning based model 420 may derive the derived probability value as a probability value that the first solder paste and the second solder paste have the obtained measurement shape information.

As described above, the machine-learning based model 420 may be learned to derive the probability values that a plurality of solder pastes have the obtained measurement shape information. The learning method of the machine-learning based model 420 described above is merely provided for the purpose of explanation, and the present disclosure is not limited thereto and the machine-learning based model 420 may be learned in various methods to derive the probability values that a plurality of solder pastes have the obtained measurement shape information.

Figure 6:
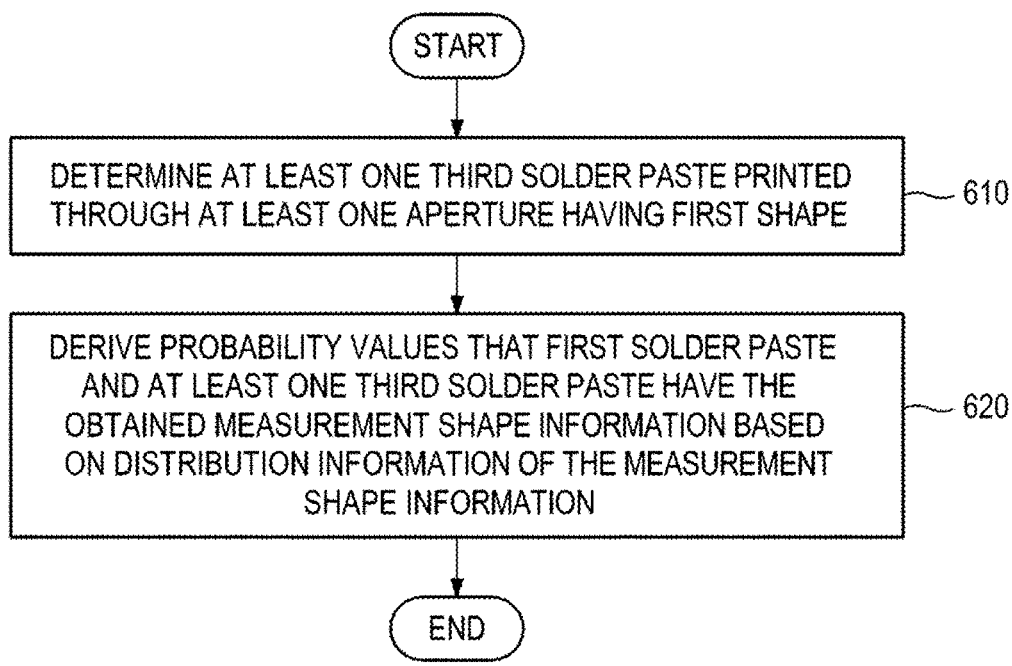
FIG. 6 is a flowchart indicating a method in which a machine-learning based model derives the probability values that each of a plurality of solder pastes that are printed through apertures having the same shape have the obtained measurement shape information according to various embodiments of the present disclosure.

FIG. 6 is a flowchart indicating a method in which a machine-learning based model derives the probability values that each of a plurality of solder pastes that are printed through apertures having the same shape have the obtained measurement shape information according to various embodiments of the present disclosure.

In step 610, the machine-learning based model stored in the memory 120 of the printed circuit board inspection apparatus 100 or stored in a memory of an electronic apparatus connected to the printed circuit board inspection apparatus 100 may determine at least one third solder paste printed on a first printed circuit board through at least one aperture having a first shape of a plurality of apertures on the basis of the aperture shape information of the plurality of apertures formed in a stencil. The stencil may be a stencil used for printing on the first printed circuit board in the screen printer 101.

In step 620, the machine-learning based model may derive probability values that a first solder paste printed through a first aperture having the first shape and at least one third solder pastes have the obtained measurement shape information on the basis of distribution information indicating distribution of the measurement shape information about the each of the plurality of solder pastes printed through the apertures having the first shape.

Figure 7:
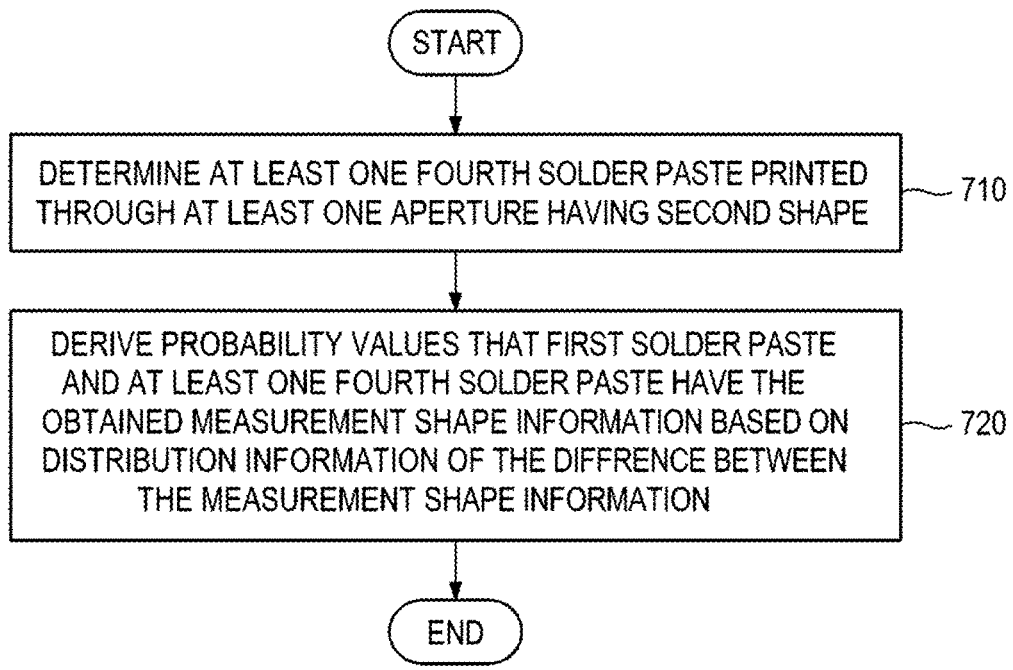
FIG. 7 is a flowchart indicating a method in which a machine-learning based model derives the probability values that each of a plurality of solder pastes have the obtained measurement shape information, using a difference of measurement shape information of each of the plurality of solder pastes according to various embodiments of the present disclosure.

FIG. 7 is a flowchart indicating a method in which a machine-learning based model derives the probability values that each of a plurality of solder pastes have the obtained measurement shape information, using a difference of measurement shape information of each of the plurality of solder pastes according to various embodiments of the present disclosure.

In step 710, the machine-learning based model stored in the memory 120 of the printed circuit board inspection apparatus 100 may determine at least one fourth solder paste printed through at least one aperture having a second shape of a plurality of apertures on the basis of the aperture shape information of the plurality of apertures formed in a stencil.

In step 720, the machine-learning based model may derive the probability value that a first solder paste printed through an aperture having a first shape and the at least one fourth solder paste have the obtained measurement shape information on the basis of distribution information indicating distribution of the difference between the measurement shape information about a solder paste printed through an aperture having a first shape and a solder paste printed through an aperture having the second shape.

Figure 8:
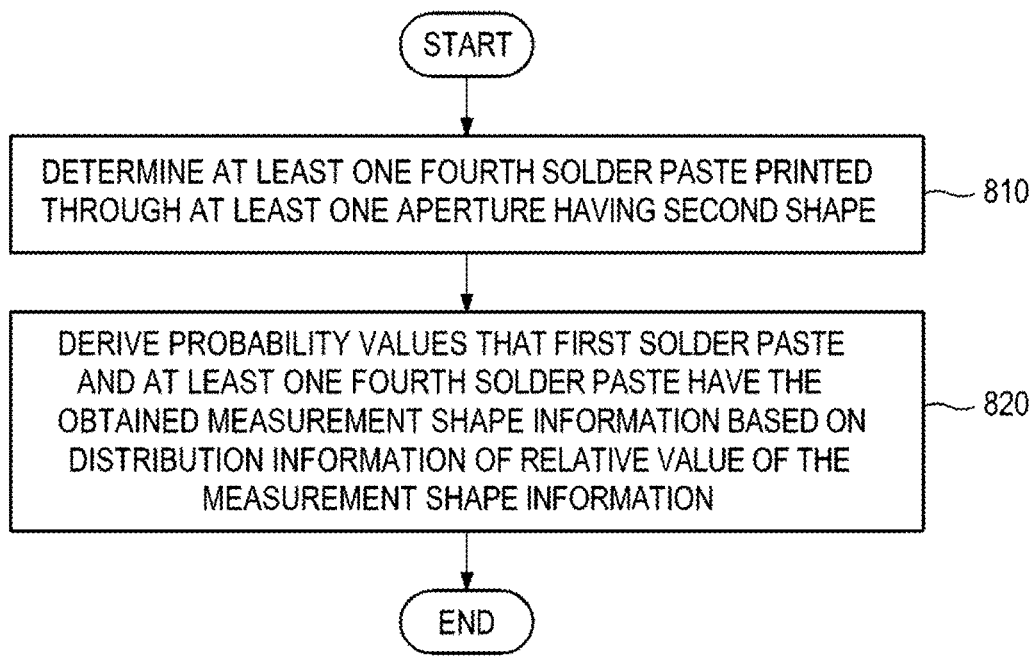
FIG. 8 is a flowchart indicating a method in which a machine-learning based model derives the probability values that each of a plurality of solder have the obtained measurement shape information by comparing the measurement shape information of each of the plurality of solder pastes according to various embodiments of the present disclosure.

FIG. 8 is a flowchart indicating a method in which a machine-learning based model derives the probability values that each of a plurality of solder have the obtained measurement shape information by comparing the measurement shape information of each of the plurality of solder pastes according to various embodiments of the present disclosure.

In step 810, the machine-learning based model stored in the memory 120 of the printed circuit board inspection apparatus 100 may determine at least one fourth solder paste printed through at least one aperture having a second shape of a plurality of apertures on the basis of the aperture shape information of the plurality of apertures formed in a stencil.

In step 820, the machine-learning based model may derive the probability value that a first solder paste printed through an aperture having a first shape and the at least one fourth solder paste have the obtained measurement shape information on the basis of distribution information indicating distribution of a relative value of the measurement shape information about a solder paste printed through an aperture having a first shape and a solder paste printed through an aperture having the second shape.

In order to derive the probability that solder pastes printed through apertures having different shapes having the obtained measurement shape information, one of the methods described with reference to FIGS. 7 and 8 may be selected and used, or both of the methods described with reference to FIGS. 7 and 8 may be used, depending on the learning method of a machine-learning based model.

FIG. 9 is a flowchart indicating a method of determining whether an anomaly in a solder paste occurred using probability values derived by a machine-learning based model according to various embodiments of the present disclosure.

In step 910, the processor 130 may determine whether the number of probability values, which are equal to or less than a predetermined threshold, of the probability values obtained from the machine-learning based model is equal to or greater than a set number. The threshold value and the number, as described above, may be adjusted by comparing the detection result with whether the anomaly in a solder paste is actually occurred after the detection of whether the anomaly in the solder paste occurred.

In step 920, when the number of probability values, which are equal to or less than a predetermined threshold value, is equal to or greater than a predetermined number, in the obtained probability values, the processor 130 may detect that an anomaly in the first solder paste occurred.

In step 930, when the number of probability values, which are equal to or less than a predetermined threshold value, is less than the predetermined number, in the obtained probability values, the processor 130 may detect that the anomaly in the first solder paste does not occurred.

The processor 130, after determining whether the anomaly in the first solder paste occurred, may perform the same process on the other solder pastes other than the first solder paste in the solder pastes printed on the first printed circuit board. Accordingly, the processor 130 may detect whether an anomaly in at least one solder paste of the plurality of solder pastes printed on the first printed circuit board occurred.

Although the method was described through specific embodiments, the method may be implemented by computer-readable codes on a computer-readable recording medium. The computer-readable recording medium includes all kinds of recording devices that store data that may be read by a computer system. The computer-readable recording medium may include a ROM, a RAM, a CD-ROM, an optical data storage etc. Further, the computer-readable recording mediums may be distributed to computer systems that are connected through a network and may store and execute codes that may be divisionally read by computers. Further, functional programs, codes, and code segments for implementing the embodiments may be easily inferred by programmers in the art.

Although the spirit of the present disclosure was described with reference to the embodiments and the examples shown in the figures, it should be understood that the present disclosure may be replaced, changed, and modified by those skilled in the art in various ways without departing from the spirit and scope of the present disclosure. Further, those replacements, changes, and modifications should be considered as being included in the claims.

What is claimed is:

1. A printed circuit board inspection apparatus comprising:
a memory configured to store a machine-learning based model configured to derive a probability value that each of two solder pastes have measurement shape information about each of the two solder pastes when the two solder pastes are printed on a printed circuit board through two apertures having a predetermined aperture shape, which are formed in a stencil, using aperture shape information of the two apertures and the measurement shape information about each of the two solder pastes; and
a processor electrically connected with the memory,
wherein the processor is configured to:
obtain measurement shape information about each of a plurality of solder pastes printed on a first printed circuit board through a plurality of apertures formed in the stencil and aperture shape information about each of the plurality of apertures,
obtain probability values that a first solder paste printed through a first aperture of the plurality of apertures and each of a plurality of second solder pastes printed through second apertures other than the first aperture of the plurality of apertures have the measurement shape information when the first solder paste and the plurality of second solder pastes are printed on the first printed circuit board, by applying the obtained measurement shape information and the obtained aperture shape information to the machine-learning based model, and
detect whether an anomaly in the first solder paste occurred based on the obtained probability values.

2. The apparatus of claim 1, wherein the measurement shape information includes at least one of volume information, height information, and area information of a solder paste.

3. The apparatus of claim 1, wherein the machine-learning based model is learned to derive a probability value that the each of the two solder pastes have the measurement shape information about each of the two solder pastes when the two solder pastes are printed on the printed circuit board through the two apertures based on first information indicating previously learned distribution of measurement shape information about solder pastes printed through each of the plurality of apertures.

4. The apparatus of claim 3, wherein the machine-learning based model derives the probability value that the first solder paste and each of the plurality of solder pastes have the measurement shape information when the first solder paste and the plurality of solder pastes are printed on the first printed circuit board based on the first information.

5. The apparatus of claim 1, wherein the machine-learning based model is learned to derive a probability value that each of the two solder pastes have the measurement shape information about each of the two solder pastes when the two solder pastes are printed on the printed circuit board through the two apertures based on second information indicating previously learned distribution about a difference between measurement shape information of each of a plurality of solder pastes.

6. The apparatus of claim 5, wherein the machine-learning based model derives the probability value that the first solder paste and each of the plurality of solder pastes have the measurement shape information when the first solder paste and the plurality of solder pastes are printed on the first printed circuit board based on the second information.

7. The apparatus of claim 1, wherein the processor detects that the anomaly in the first solder paste occurred, when the number of probability values, which are equal to or less than a predetermined threshold value, of the obtained probability values is equal to or greater than a set number.

8. The apparatus of claim 1, wherein the processor detects that the anomaly in the first solder paste does not occurred, when the number of probability values, which are less than a predetermined threshold value, of the obtained probability values is less than a set number.

9. The apparatus of claim 1, further comprising:
an image sensor configured to obtain an image of the first printed circuit board,
wherein the processor obtains the measurement shape information about each of the plurality of solder pastes printed on the first printed circuit board from the image obtained by the image sensor, and
obtains the aperture shape information about each of the plurality of apertures through design information related to the first printed circuit board.

10. A non-transitory computer-readable recording medium having a program to be executed by a computer, wherein the program includes executable instructions that instruct a processor, when the program is executed by the processor, to perform:
obtaining measurement shape information about each of a plurality of solder pastes printed on a first printed circuit board through a plurality of apertures formed in a stencil and aperture shape information about each of the plurality of apertures;
obtaining probability values that a first solder paste printed through a first aperture of the plurality of apertures and each of a plurality of second solder pastes printed through second apertures other than the first aperture of the plurality of apertures have the measurement shape information when the first solder paste and the plurality of second solder pastes are printed on the first printed circuit board, by applying the obtained measurement shape information and the obtained aperture shape information to a machine-learning based model, and
detecting whether an anomaly in the first solder paste occurred based on the obtained probability values, and
wherein the machine-learning based model is derive a probability value that each of two solder pastes have measurement shape information about each of the two solder pastes when the two solder pastes are printed on a printed circuit board through two apertures having a predetermined aperture shape, which are formed in a stencil, using aperture shape information of the two apertures and the measurement shape information about each of the two solder pastes.

11. The computer-readable recording medium of claim 10, wherein the measurement shape information includes at least one of volume information, height information, and area information of a solder paste.

12. The computer-readable recording medium of claim 10, wherein the machine-learning based model is learned to a probability value that the each of the two solder pastes have the measurement shape information about each of the two solder pastes when the two solder pastes are printed on the printed circuit board through the two apertures based on first information indicating previously learned distribution of measurement shape information about solder pastes printed through each of the plurality of apertures.

13. The computer-readable recording medium of claim 12, wherein the machine-learning based model derives the probability value that the first solder paste and each of the plurality of solder pastes have the measurement shape information when the first solder paste and the plurality of solder pastes are printed on the first printed circuit board based on the first information.

14. The computer-readable recording medium of claim 10, wherein the machine-learning based model is learned to derive a probability value that each of the two solder pastes have the measurement shape information about each of the two solder pastes when the two solder pastes are printed on the printed circuit board through the two apertures based on second information indicating previously learned distribution about a difference between measurement shape information of each of a plurality of solder pastes.

15. The computer-readable recording medium of claim 14, wherein the machine-learning based model derives the probability value that the first solder paste and each of the plurality of solder pastes have the measurement shape information when the first solder paste and the plurality of solder pastes are printed on the first printed circuit board based on the second information.

16. The computer-readable recording medium of claim 12, wherein the detecting whether an anomaly in the first solder paste occurred includes detecting that the anomaly in the first solder paste occurred, when the number of probability values, which are equal to or less than a predetermined threshold value, of the obtained probability values is equal to or greater than a set number.

17. A method for detecting an anomaly in a solder paste by a printed circuit board inspection apparatus, the method comprising:
obtaining measurement shape information about each of a plurality of solder pastes printed on a first printed circuit board through a plurality of apertures formed in a stencil and aperture shape information about each of the plurality of apertures;
obtaining probability values that a first solder paste printed through a first aperture of the plurality of apertures and each of a plurality of second solder pastes printed through second apertures other than the first aperture of the plurality of apertures have the measurement shape information when the first solder paste and the plurality of second solder pastes are printed on the first printed circuit board, by applying the obtained measurement shape information and the obtained aperture shape information to a machine-learning based model, and
detecting whether an anomaly in the first solder paste occurred based on the obtained probability values, and
wherein the machine-learning based model is derive a probability value that each of two solder pastes have measurement shape information about each of the two solder pastes when the two solder pastes are printed on a printed circuit board through two apertures having a predetermined aperture shape, which are formed in a stencil, using aperture shape information of the two apertures and the measurement shape information about each of the two solder pastes.

* * * * *